(12) United States Patent
Liu (10) Patent No.: US 9,324,438 B2
(45) Date of Patent: Apr. 26, 2016

(54) METHOD OF OPERATING INCREMENTALLY PROGRAMMABLE NON-VOLATILE MEMORY

(71) Applicant: David K. Y. Liu, Fremont, CA (US)

(72) Inventor: David K. Y. Liu, Fremont, CA (US)

(73) Assignee: JONKER LLC, Zephyr Cove, NV (US)

(*) Notice: Subject to any disclaimer, the term of this patent is extended or adjusted under 35 U.S.C. 154(b) by 0 days.

(21) Appl. No.: 14/452,275

(22) Filed: Aug. 5, 2014

(65) Prior Publication Data

US 2015/0036428 A1    Feb. 5, 2015

Related U.S. Application Data

(60) Provisional application No. 61/862,185, filed on Aug. 5, 2013.

(51) Int. Cl.
| | |
|---|---|
| *G11C 16/04* | (2006.01) |
| *G11C 16/10* | (2006.01) |
| *H01L 27/112* | (2006.01) |
| *G11C 16/22* | (2006.01) |
| *G11C 17/12* | (2006.01) |

(52) U.S. Cl.
CPC ............ *G11C 16/10* (2013.01); *G11C 16/0416* (2013.01); *G11C 16/22* (2013.01); *H01L 27/11206* (2013.01); *G11C 17/12* (2013.01)

(58) Field of Classification Search
CPC .... G11C 11/5628; G11C 16/16; G11C 16/10; G11C 2211/5644
USPC ........................... 365/185.03, 185.14, 185.18
See application file for complete search history.

(56) References Cited

U.S. PATENT DOCUMENTS

| | | | |
|---|---|---|---|
| 4,409,670 A | 10/1983 | Herndon et al. | |
| 5,598,368 A * | 1/1997 | Takahashi et al. | ....... 365/185.01 |
| 6,363,010 B2 * | 3/2002 | Tanaka et al. | ............ 365/185.03 |
| 6,438,035 B2 * | 8/2002 | Yamamoto et al. | ...... 365/185.21 |
| 6,625,734 B1 | 9/2003 | Marvit et al. | |
| 7,199,394 B2 | 4/2007 | Mandell et al. | |
| 7,260,672 B2 | 8/2007 | Garney | |
| 7,273,766 B1 | 9/2007 | Lan et al. | |
| 7,679,945 B2 | 3/2010 | Rizzo et al. | |
| 7,881,108 B2 | 2/2011 | Cornwell et al. | |
| 8,327,068 B2 | 12/2012 | Nakanishi et al. | |
| 8,331,128 B1 | 12/2012 | Derhacobian et al. | |
| 8,374,746 B2 | 2/2013 | Plante | |
| 8,456,880 B2 | 6/2013 | Norman | |
| 8,488,397 B2 | 7/2013 | Elfadel et al. | |

(Continued)

FOREIGN PATENT DOCUMENTS

CN            103730164 A      4/2014

OTHER PUBLICATIONS

Geldman, J. Sanitize Command, Plenary, Jun. 10, 2008, 9 pages, CA.

(Continued)

*Primary Examiner* — Tuan T Nguyen
(74) *Attorney, Agent, or Firm* — Law Office of J. Nicholas Gross, P.C.

(57) ABSTRACT

An array of programmable non-volatile devices, such as a nominal OTP cell, is operated such that a $V_t$ representing a particular binary logic state is changed over time. This allows for re-programming and emulating a few times or multi-time programmable device.

14 Claims, 4 Drawing Sheets

(56) References Cited

U.S. PATENT DOCUMENTS

| | | | |
|---|---|---|---|
| 8,745,347 | B2 | 6/2014 | Ferren et al. |
| 8,817,530 | B2 | 8/2014 | Alam et al. |
| 8,909,725 | B1 | 12/2014 | Sehn |
| 2003/0076718 | A1 | 4/2003 | Rolandi |
| 2005/0051053 | A1 | 3/2005 | Wisnudel et al. |
| 2006/0126484 | A1 | 6/2006 | LeBlanc et al. |
| 2007/0233955 | A1 | 10/2007 | Luo et al. |
| 2008/0162869 | A1 | 7/2008 | Kim et al. |
| 2009/0208692 | A1 | 8/2009 | Lindholm et al. |
| 2009/0244976 | A1 | 10/2009 | Kajimoto |
| 2011/0134704 | A1* | 6/2011 | Lee .................. 365/185.22 |
| 2012/0008413 | A1 | 1/2012 | Jeong |
| 2012/0069667 | A1 | 3/2012 | Shirakawa |
| 2012/0208595 | A1 | 8/2012 | Norman |
| 2012/0292613 | A1 | 11/2012 | Shionoiri et al. |
| 2013/0070530 | A1 | 3/2013 | Chen et al. |
| 2013/0176792 | A1 | 7/2013 | Lee |
| 2013/0265830 | A1 | 10/2013 | Bisen |
| 2013/0290443 | A1 | 10/2013 | Collins et al. |
| 2013/0346805 | A1 | 12/2013 | Sprouse et al. |
| 2014/0043901 | A1 | 2/2014 | Kwak |
| 2014/0068183 | A1 | 3/2014 | Joshi et al. |
| 2015/0100793 | A1 | 4/2015 | Newell |

OTHER PUBLICATIONS

Grupp, L., et al., Reliably Erasing Data From Flash-Based Solid State Drives, Feb. 2011, 13 pages, UCSD, CA.

Kissel, R. et al., Guidelines for Media Sanitization, NIST Special Publication, Dec. 2014, 64 pages, NIST, MD.

Wei, M. Safe: Fast, Verifiable Sanitization for SSDs Or: Why Encryption Alone is not a Solution for Sanitizing SSDs, Oct. 2010, 5 pages, UCSD, CA.

Aritome, S. et al. Reliability Issues of Flash Memory Cells, Proceedings of the IEEE, May 5, 1993, 13 pages, vol. 81, IEEE.

Chiquet, P. et al. Charge Loss Activation During Non-Volatiles Memory Data Retention, Semiconductor Confrence (CAS), Oct. 2012, vol. 2, Sinaia, Romania.

Choi, J. et al. Charge Loss Mechanisms in a Stacked-Gate Flash EEPROM Cell with an ONO Inter-Poly Dielectric, Journal of the Korean Physical Society, Dec. 2001, 4 pages, vol. 39, Korea.

Gao, W. et al. The Floating Gate MOS Device as an Analog Element for Analog Trimming, Microelectronics Journal, Aug. 1994, 8 pages, vol. 25, Elsevier Ltd.

Gerber, A. et al. Low-voltage Operation of Metal-ferroelectric Insulator-semiconductor Diodes Incorporating a Ferroelectric Polyvinylidene Fluoride Copolymer Langmuir-Blodgett Film, Journal of Applied Physics, Jul. 26, 2006, 7 pages, Stephan Ducharme Publications, University of Nebraska, US.

Huang, Y., Amorphous Silicon TFT Based Non-Volatile Memory, Novel Approaches to Amorphous Silicon Thin Film Transistors for Large Area Electronics, Nov. 2011, 85 pages, Princeton University, US.

Patrizio, A., DVDs That Self-Destruct, Science: Discoveries, Jan. 2000, 2 pages, Wired.com, US.

Reece, T. Characterization of Metalferroelectric-Insulator-Semiconductor Structures Based on Ferroelectric Langmuir-Blodgett Polyvinylidene Fluoride Copolymer Films for Nondestructive Random Access Memory Applications, Dissertation, Dec. 2007, 101 pages, University of Nebraska, US.

Sakai, S., et al. Recent Progress of Ferroelectric-Gate Field-Effect Transistors and Applications to Nonvolatile Logic and FeNAND Flash Memory, Open Access Materials, Nov. 18, 2010, 15 pages, vol. 3, MDPI, Switzerland.

Vasileska, D. Modeling of Non-Volatile Memories With Silvaco, Presentation, 2014, 70 pages, Arizona State University, US.

Zhao, C. et al. Review on Non-Volatile Memory with High-k Dialectrics Flash for Generation Beyond 32nm, Open Access Materials, Jul. 15, 2014, 29 pages, University of Liverpool, UK.

Hur, J. H. Non-Final Office Action in U.S. Appl. No. 14/452,269. USPTO. Sep. 3, 2015. pp. 1-14.

* cited by examiner

UNPROGRAMMED (1111)

PROGRAM 0101

ERASE (PROGRAM TO NEW Vt for 1111)

PROGRAM 1010 (New Vt for logical 0)

ERASE (PROGRAM TO NEW Vt for 1111)

FIGURE 4

METHOD OF OPERATING INCREMENTALLY PROGRAMMABLE NON-VOLATILE MEMORY

RELATED APPLICATION DATA

The present application claims the benefit under 35 U.S.C. 119(e) of the priority date of Provisional Application Ser. No. 61/862,185 filed Aug. 5, 2013 which is hereby incorporated by reference.

FIELD OF THE INVENTION

The present invention relates to non-volatile memories which can be programmed one time, or multiple times in some instances. The invention has particular applicability to applications where is it desirable to effectuate inexpensive memory storage and to calibrate, customize, update or alter operation of electronic circuits.

BACKGROUND

One time programmable (OTP) and multi-time programmable (MTP) memories have been recently introduced for beneficial use in a number of applications where customization is required for both digital and analog designs. These applications include data encryption, reference trimming, manufacturing ID, security ID, and many other applications. These devices now occupy an important segment of the Non-volatile Memory market and applications. In addition OTP and MTP devices are optimal choices for extremely low cost, fast solid state random access memory for write once, read-many applications. The savings in cost are derived chiefly by the removal of overhead required to support the erase operation. This is particularly important for maturing services such as social networks and other platforms that are heavy users of multi-media data that is created and stored, but then rarely changed (i.e., pictures, audio, videos, etc.) The archiving of these massive data necessitates a low cost flash memory that are stripped of any traditional cumbersome overhead, yet still maintain the ability to support low number of re-write.

Traditionally, OTP devices are implemented with either EPROM device structures or antifuse structures, where the devices are designed to be (and can be) single bit and programmed only once. The most commonly used EPROM structure is typically a floating gate storage device where electrons are injected and stored on the floating gate. The injection mechanism for programming can either be channel hot electron injection or Fowler-Nordheim electron tunneling. The advantage of these OTP implementations is that they are CMOS/logic compatible, and usually require very few additional masking/processing steps. In most instances, since an integrated circuit includes a high voltage driver component, the floating gate oxide manufacturing can be integrated as part of a high voltage I/O transistor processing module.

An OTP memory array offers simple non-volatile data storage on integrated circuits. The low cost of implementing an OTP makes it a good solution for applications that rarely (or never) require re-programming of the stored data. The low cost of current OTP implementations mainly comes from the fact that no complicated schemes and support circuitry are required to facilitate an erase operation. That is, a typical erase operation would require voltage of opposite polarities, as compared to a programming operation. This is especially true for a NVM device that is implemented with storage of injected electrons unto a floating gate.

While OTP devices are useful in many applications, there are other high-value applications requiring multi-time programmable (MTP) memory that can provide the ability for the device to be updated. Among other reasons, some devices become degraded from aging or changes in their operating environment. In addition some applications may benefit from so-called multi-level or multi-bit capability in which the state of a cell can be set to something more than just two states, including in some instances an odd number of states. Thus, for example it may become necessary to re-calibrate and re-trim a mixed signal circuit like a high-performance DAC that is frequently are integrated in today's complex SoCs. Other examples known in the art, including access key revocation, upgrading to code revisions, periodic data logging, etc. also benefit from few-time or multi-time programmable capability.

MTP memory, such as EEPROM or flash memory, is repeatedly programmable to update data, and has specific circuits for erasing, programming, and reading operations. Unlike MTP memory, OTP memory does not use an erasing circuit, so the circuit for controlling the operations of the OTP memory is simpler than the circuit for controlling the operations of the MTP memory, even though it lacks multi-programmable capability. To emulate a multi-time programmable array and implement more than one programming/erase cycle, the prior art is limited typically to an OTP redundancy scheme that mimics multiple programming features. That is, a separate OTP array with separate cells is programmed for each cycle. An example of this is offered by Kilopass under the trade name Itera. In that approach a memory block there consists of a memory array and analog and digital circuits including high voltage switches, charge pump, bandgap, controller, etc. The memory array is partitioned in into separate sub-arrays, one for each desired program cycle. Thus when the device is programmed for the first time, a controller writes to the first sub-array and when the device is reprogrammed, the controller writes to the second sub-array and so on. In essence, one or more completely redundant arrays of cells is used for each time the array needs to be updated. While these cells are small, this scheme costs additional silicon real estate.

Thus it is desirable to have a new type of OTP device that can have more than one program/erase cycle, so that it can effectively implement a multi-time or few-time programmable array. It would also be desirable for such OTP memory to minimize the overhead cost of implementing an erase operation/erase algorithm and additional die space.

A recent filing by Bisen (US Pub. No. 2013/0265830—incorporated by reference herein) attempts to rectify these kinds of deficiencies in the art. While Bisen proposes a multiple writes with a flash memory cell that uses shifting $V_t$s, he nonetheless still uses an erase circuit which adds complexity and overhead and thus is not a true OTP implementation. Furthermore his scheme suffers from a few drawbacks, including the fact that the data of the system is not erased between program operations, but only at the end when he has run out of available higher $V_t$ states. Bisen simply over-writes his old data while adding new data, meaning that there is some remnant of the prior data, rather than configuring all the data to an initial common state. This can result in potential data breaches, security issues, etc.

SUMMARY OF THE INVENTION

An object of the present invention, therefore, is to overcome the aforementioned limitations of the prior art.

A first aspect of the invention therefore concerns a programmable non-volatile device situated on a substrate comprising: a floating gate, a control gate, a source region, a drain region, and a channel coupling said source region and said drain region. The programmable non-volatile device is adapted to be set to a first single binary logic state (1 or 0) at both at least a first threshold voltage (Vt1) and a second different threshold voltage (Vt2) which is higher than Vt1.

Another aspect of the invention concerns a programmable non-volatile device adapted to be placed into an erased state, or a reset state, by increasing a first threshold voltage (Vt1) associated with the device to a second different threshold voltage (Vt2) which is higher than Vt1. The device can be adapted to be set to a second single binary logic state (1 or 0) at both at least a new first threshold voltage (Vt2) and a new second different threshold voltage (Vt3) which is higher than Vt2.

A further aspect concerns a programmable non-volatile device having at least a first programmed state and a second unprogrammed state which can varied in time and in which a control gate is configured to apply a programming voltage to the device. The programming voltage includes at least a first voltage value and a second higher voltage value. A floating gate coupled to the control gate stores a first charge amount corresponding to the first programmed state in response to the first voltage value being applied at a first programming time. The floating gate is further adapted to store a second charge amount that also corresponds to the first programmed state in response to the second voltage value being applied at a second programming time. Thus the device stores a first unique binary programmed state (1 or 0) at different times using both a first threshold value and a second separate threshold value set for the device. Still another aspect concerns a method of programming a non-volatile device in which an operation for both writing and erasing of the logic state of the programmable non-volatile device is done by addition of channel hot electrons to the floating gate. Therefore the device does not need to have circuit provision to pass electrons in both polarities.

A further aspect is directed a method of reading a non-volatile memory device in which a control gate voltage applied during a read operation for determining the logic state changes over time, such that:
i) a first voltage value is used for a read operation after data for a first logic value is first written data into the memory device; and
ii) a second voltage value is used for a read operation after data representing the same first logic value is written at a later time to the memory device.

Another aspect concerns a method of programming a non-volatile memory cell that is adapted to store data corresponding to a first logic value and a second logic value including performing a first program operation to store the first logic value in the cell by setting a threshold voltage of such cell to a first value; and performing a second subsequent program operation to store the same first logic value in the cell by increasing a threshold voltage of such cell to a second value that is higher than the first value. In certain embodiments the memory cell is programmed in each subsequent program operation to the same first logic value by increasing a threshold voltage of such cell. The non-volatile memory cell is preferably erased by adding charge to such cell. In some embodiments a multi-bit cell can be used, in which a third logic value is also store.

Other aspects include methods of dividing a total capacity (Ct) of an non-volatile memory array containing M cells and N distinct program levels into P distinct periods by performing a first program operation in a 1st period of the P distinct periods to store logical data in the M cells of the array using at least two (2) or more separate program levels {PVt1, PVt2} of the N distinct program levels; and then performing a second program operation in a subsequent 2nd period of the P distinct periods to store logical data in the M cells of the array using at least (2) separate program levels {PVt3, PVt4} of the N distinct program levels, wherein at least one of {PVt3, PVt4} is different from and greater than {PVt1, PVt2}. In these methods the array is preferably "erased" between program operations by adding charge to a floating gate of each of the M cells. In embodiments of this approach a threshold value of programmed cells is increased during each subsequent program operation in the P distinct periods. A total capacity of the array Ct is thus time multiplexed into an available capacity Ca=Ct/P at any moment in time. The M cells can also store a multi-bit logic value during at least one of the P distinct periods.

Yet another aspect concerns a method of programming an array of non-volatile memory cells, where each cell in the array is adapted to store data corresponding to a first logic value and a second logic value by configuring all cells in the array to have a first threshold value corresponding to a non-programmed UV state; storing a first data pattern in the array by performing a program operation to store the second logic value in a first set of selected cells of the array, by increasing a threshold voltage of such first set of selected cells to a second threshold value that is higher than the first threshold value of non-selected cells; re-programming the array to store a second different data pattern, and so that a second set of selected cells in the array store the second logic value; the re-programming is preferably accomplished by setting all cells in the array to a second threshold value; and increasing a threshold voltage of the second set of selected cells to a third threshold value that is higher than the second threshold value of non-selected cells.

In some applications the device can be integrated as part of a programmable array embedded with separate logic circuits and/or memory circuits in an integrated circuit. Such circuit may be one of the following: a data encryption circuit; a reference trimming circuit; a manufacturing ID; a security ID, or any other circuit that requires customized non-volatile data.

The devices are preferably embedded in a computing circuit and formed entirely by masks/CMOS processing used to form other logic and/or memory n-channel devices in the processing circuit. In some instances the non-volatile programmable memory device is used to store one or more identification codes for die/wafers.

It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions. While described in the context of a non-volatile memory array, it will be apparent to those skilled in the art that the present teachings could be used in any number of applications.

DETAILED DESCRIPTION

The present disclosure concerns a new type of non-volatile memory device that includes a variable threshold for establishing a particular and unique logic state. The threshold is preferably changed with time; in particular, whenever it is desired to re-program the device. This achieves a desired reprogrammability function without the need for a separate conventional erase operation (since the "reset" erase operation of the present disclosure effectively writes all the cells to a common state—the previous programmed state) erase supporting circuitry overhead, etc. As the preferred architecture/method is compatible with any floating gate based OTP device, it is also fully compatible with advanced CMOS logic process, and/or requires, at the worst case, very minimal additional steps to implement.

As mentioned earlier, in traditional OTP devices, circuits to implement an erase algorithm and erase operation are not included. In its intrinsic or native (UV) unprogrammed state, the OTP device in an array is considered to store a logical data value one (1) as there is no charge present on the floating gate which could impede a channel current. To program the device to a zero (0) logical data state the device is subjected to a single harsh program operation to put it into a high voltage state, i.e., by addition of electrons to the floating gate. This establishes a high voltage threshold for the device; i.e., a substantial voltage must be imposed on a control gate to turn the device on.

In a conventional OTP array, once the cell is programmed to a high threshold voltage, there is no way to bring the threshold voltage back down since there is no erase feature to remove the electrons from the floating gate. The cell's state is detected by using a read voltage (or the voltage applied on the gate of the cell) that is typically halfway between the target programmed Vt and a UV Vt for the cell. If the cell is programmed (i.e. has acquired enough charge), the applied read voltage will not turn on the OTP cell, and thus no read current can be detected. However, if the cell is in its intrinsic or UV Vt state, or low Vt state, the read voltage will turn on the cell, and a read current can be sensed from the cell. Alternatively, the cell's threshold voltage state can be detected by comparing the cell's current to that of a reference cell for a particular applied read voltage. Cells with current less than the current of the reference cell are considered as programmed to a high Vt (State 0), and conversely, cells with current exceeding the current of the reference cell are considered as a low Vt cell (State 1).

Figure 1:
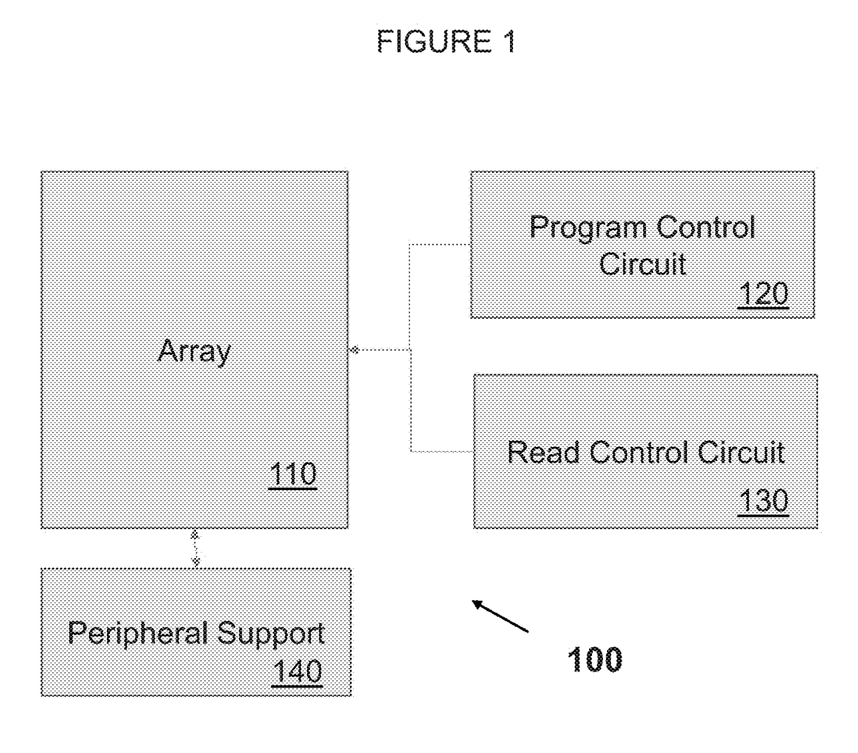
FIG. 1 is a top down view of an exemplary embodiment of a non-volatile memory array.

The preferred circuit architecture of the present invention is shown generally in FIG. 1. The non-volatile memory device 100 preferably includes an array of FG cells 110 that arcoupled to a program control circuit 120, a read control circuit 130, and other conventional peripheral support circuits 140. As mentioned above the array 110 can be comprised of any conventional known EPROM type cells that can be predictably and reliable programmed to a variable detectable threshold state during different program/erase cycles or time periods to effectuate the goals stated herein. Thus the invention is not limited to any specific form of EPROM type cell, as long as it utilizes some form of floating gate, capacitor or other electron storage element that can in turn control current flow in a channel to establish and identify a logical state of the cell. A conventional EPROM cell (see FIG. 3) includes a floating gate, a control gate, a source region, a drain region, and a channel coupling the source and drain regions. In some instances, such as shown in U.S. Pat. No. 8,300,470 a control gate is not required. Biasing for program and read operations is typically achieved through voltage control signals applied to the control gate and/or source/drain. A program control circuit 120 is preferably adapted with hardware and/or firmware logic to effectuate a program operation for the device, including by programming cells in the array 110 in accordance with the operational requirements specified below, including with reference to FIGS. 2, 3 and 4. As alluded to below, program control circuit 110 preferably also imitates and effectuates a pseudo "erase" operation by altering a non-programmed cell threshold state over time. This permits array 110 to implement a multi-time programmable function in a nominal array size and without resort to redundancy. It should be understood of course, that embodiments of the present invention could also be implemented with redundancy to further increase a programming capacity. The specific implementation of program control circuit 120 can be achieved by any number of techniques known in the art and thus the invention is not limited in this respect.

Similarly, read control circuit 130 is adapted with hardware and/or firmware logic to read cells in the array 110 in accordance with the operational requirements specified below, including with reference to FIGS. 2, 3 and 4. As with program control circuit 120 the specific implementation of such circuit 120 can be achieved by any number of techniques known in the art and the present invention is not limited in this respect. As further noted above, preferred embodiments of the present disclosure are based on an OTP architecture/implementation, in which overhead for an additional erase controller circuit, or erase algorithm is avoided.

Figure 2:
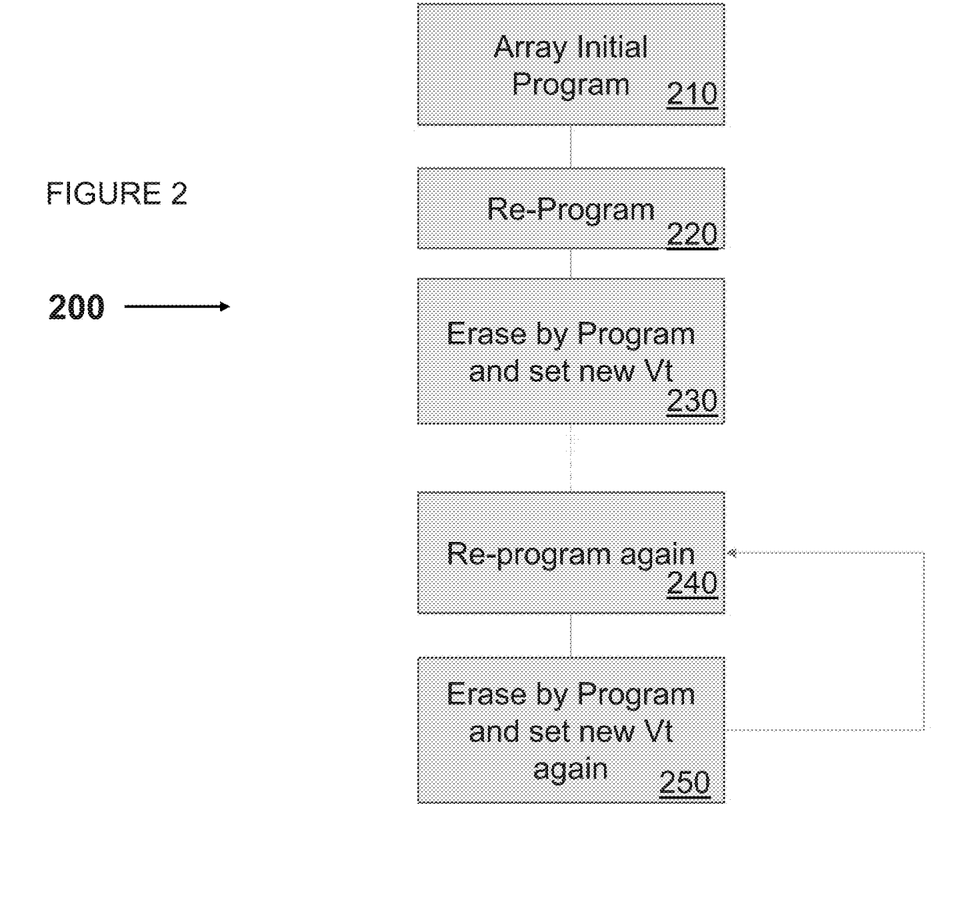
FIG. 2 is a flowchart identifying the main operational steps used in exemplary embodiments of the present invention.

An exemplary process 200 for operating device 100 is shown in the flowchart of FIG. 2. Embodiments of the present invention preferably use a finer programming increment than that is used in the prior art to program a cell. This means that a program window or range used to demarcate a program and erase state is preferably changed over subsequent different number of program/erase cycles. Conversely a different read voltage is also used respectively for each P/E cycle, based on the program count (number) for a program/erase cycle that the cells are currently undergoing.

Embodiments of the present invention exploit a program range which, in a conventional OTP operation, uses hot carrier injection to a floating gate to achieve a Vt window of about 4 volts between a "1" state and a "0" state. This window is set much larger than necessary to simply support a binary differentiation of Vt states. In fact, however, as is known in the state of the art in the Flash memory, a Vt window of this size can be large enough to support at least four (4) different states, a result that is exploited by some multi-bit cells.

Embodiments of the present invention utilize these four (4) (or less/more) different Vt states and parlay them into three (3) (or less/more) additional programming/erase operations or cycles. A dynamic read voltage (or reference voltage) can also be adjusted with each different setting of Vt for "1" state and "0" state. For example a different program reference cell (not shown) may be used for each P/E cycle, corresponding to a desired target program cell or a different read voltage can be provided to the same reference cell to reflect the new sets of Vt values that correspond to programmed and erased states, respectively. The invention is thus only limited by the degree to which any particular cell can be programmed and differentiated over an unprogrammed cell, or the state of other programmed cells (in the case of a multi-bit cell).

For example, in an initial program cycle 210 a preferred target programming Vt is set to at 2V while a nominal UV Vt (unprogrammed) is set at 1V by program control circuit 120. The read voltage used by read control circuit 130 is preferably set at 1.5V. It will be understood that these (and the other P/E cycle program, read values discussed below) are just exemplary values, and that the actual values used in any particular embodiment is expected to be dependent primarily on the type of cell, the process technology used, available program/read circuits, etc., so the invention is not limited in this respect. A program/erase cycle counter (not shown) can be implemented in any conventional fashion by a skilled artisan to keep track of and increment a current P/E cycle. This counter can be integrated into or implemented separately to used by both program control circuit 120 and read control circuit 30.

Accordingly at the end of step 210 a first program cycle effectuated by program control circuit 120 thus preferably sets the entire array 110 to include cells with threshold voltage of either 2V or 1V, depending on a desired data pattern to be stored in the array based. When a new set of data needs to be updated at step 220 and the OTP cell array 110 needs to be re-programmed, a novel program/erase cycle is used by program control circuit 120 in which the otherwise nominal OTP cells are transformed into few-time or multi-time cells by virtue of altering their initial threshold levels representing a particular logic state.

Thus, at step 230, all cells in the array—even cells in a non-programmed state Vt level of 1 volt representing a logical 1—are "programmed" to a new nominal threshold of 2 volts by program control circuit 120. This represents a new threshold level for the logical one (1) or unprogrammed state. This novel operation can be considered a type of hybrid program/erase (P/E) cycle, since it logically erases array 110 by programming the cells, and without requiring a conventional erase circuit or operation as used in the prior art, and without removal of electrons to facilitate the erase function. Note that this erase function can be done without being part of a new programming cycle. This "erase" can be done even before new set of data is needed to write to the memory array. This provides the feature of removing the previously programmed data, and provides an added layer of privacy and security for the user.

In the array 110 this new voltage level of 2V is now considered and treated logically by the system as an erased (unprogrammed) Vt for a cell and thus the read voltage used by read control circuit 130 is stepped up to a new higher level for this 2nd P/E cycle. Therefore a new programmed Vt for a cell is set at a target of 3V for this second P/E cycle, and a new read voltage is set at a target of 2.5V.

Accordingly in some embodiments of the invention the behavior of cells in array 110 is dynamically changed over time. At this 2nd program time, a programmed cell (State 0) is nominally set at a Vt of 3V while a low Vt cell (State 1) is set at a Vt of 2.0V. Thus the whole array 110 now preferably consists of cells with a threshold voltage of either 3V or 2V, with the demarcation of State 1 or State 0 being differentiated by these two new threshold voltages.

At step 240, if the array data needs to be updated and programmed again for a 3rd time, the process can be repeated, again by resetting the threshold values of the cells in array 110. Accordingly array 110 is programmed by program control circuit 120 to be set to a new Vt of 3V by programming all the cells—including those with a present Vt of 2V—to this new 3V target program level. This 3V Vt state now represents a new low Vt state (State 1). A new high Vt level is selected as the new high Vt state (State 0).

Accordingly at 250 program control circuit 120 programs a new high Vt state (State 0) to any cell that needs to store a data of State 0. As an example, a new high Vt is set to 4V and a new read voltage used by read control circuit 130 is set to about 3.5V, in order to differentiate Vt levels between 4V and 3V. In this way, by incrementing the Vt of the programmed state and resetting the erase state Vt to be the programmed Vt of the previous P/E cycle, and updating the read voltage to be somewhere between the new programmed and erased Vt's, embodiments of the present invention essentially mimic a feature of multiple-time-programming (MTP) in an OTP cell.

Figure 3:
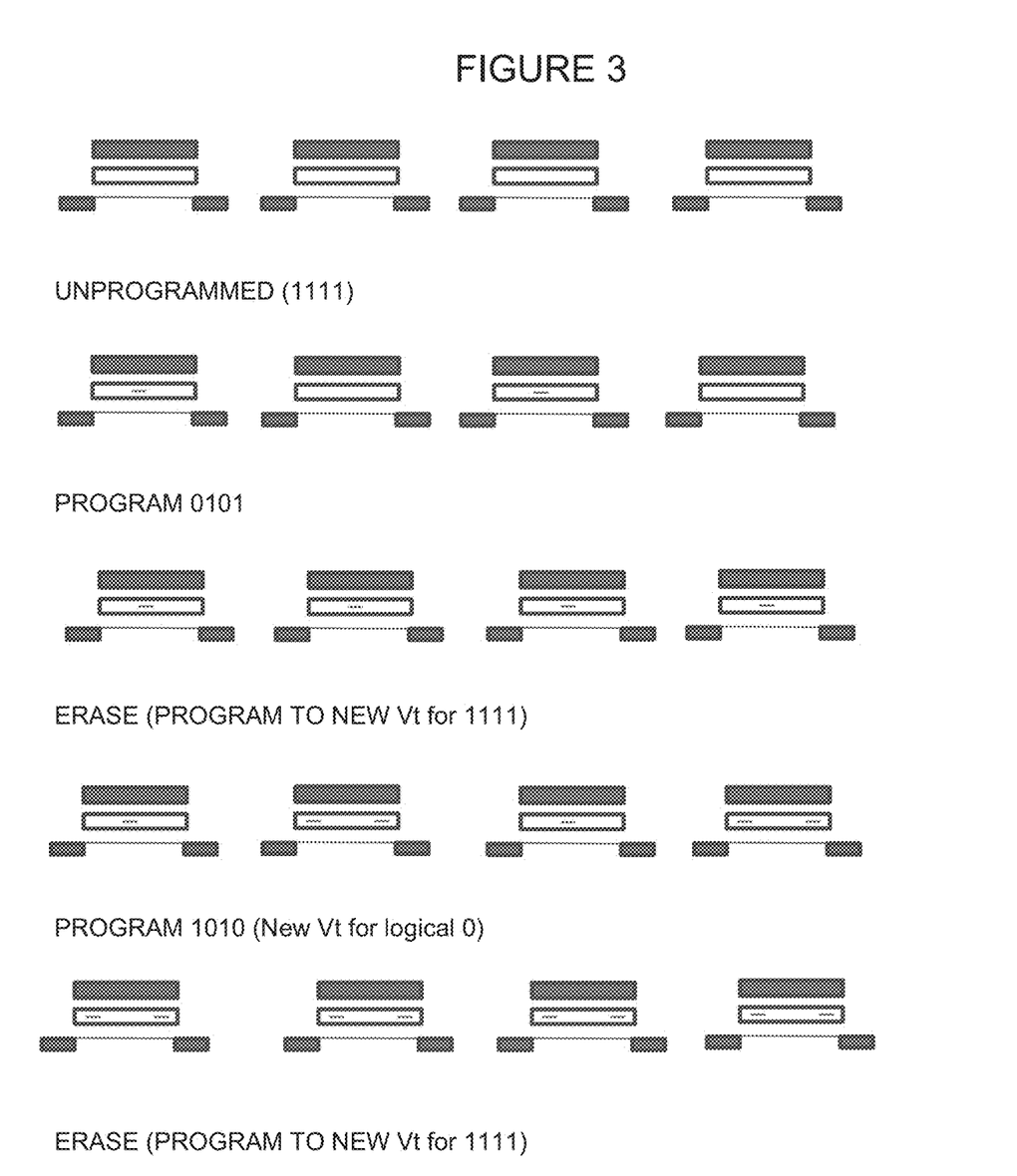
FIG. 3 illustrates visually a change in threshold states for an exemplary embodiment for programming a non-volatile memory cell.

FIG. 3 visually depicts a program/erase cycle sequence for an exemplary set of cells 300 in array 110. As seen there, a 4 cell block of OTP cell array 110 is programmed to an initial data state of 0101 and is subsequently updated to a new data of 1010. It will be understood by those skilled in the art that the state of the cell can be decoded to be logically the opposite of that shown here, depending on system requirements.

Initially—as seen at the top of FIG. 3—all the cells are at an intrinsic UV Vt, or a first Vt state corresponding to an "erased" state, or unprogrammed state, representing a logical one (1). Next, data of 0101 is written to cell array 110 by programming any target "1" cells into a second Vt state corresponding to a logical zero (0). These programmed cells are indicated by a minus sign on a floating gate, representing stored electron charge for a logical zero. A state of each cell can be sensed by the Vt difference as noted above.

Next, to write new data into array 110, first all the cells are preferably brought to the second Vt state, and this state becomes the new "erased" state. This is again represented by the single minus symbol on the cell floating gates. It should be noted that this "erase" step can be done even without a new set of data arriving. For example, this can be used as a maintenance step to remove the data that has previously been to the cell array, as part of security feature. The maintenance step can be based on a timer/counter circuit, so that data is automatically deleted after a predetermined period T. It is also worth repeating that this erase operation is done without the use of any method to remove the electrons from the floating gate, rather additional electrons are added to effectuate this pseudo erase.

Now new data of 1010 is then written into the cell array by programming the new "1" cells into a higher third Vt state. As before a state of the cell can be sensed by the new Vt difference. To further write another new set of data into the cell array, all the cells are brought to the third Vt state and this state becomes the new "erased" state. As noted earlier, this process can be repeated and continue as long as sufficient Vt window can be used.

Figure 4:
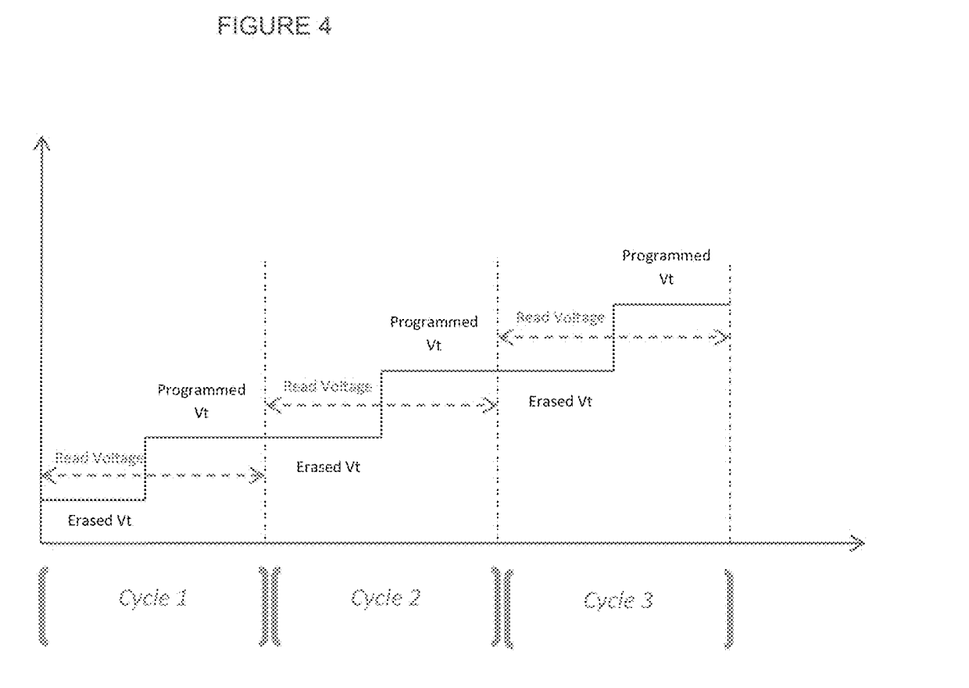
FIG. 4 is a timing diagram depicting an exemplary program cycle/threshold state relationship of the present device.

FIG. 4 is a timing diagram depicting an exemplary program cycle/threshold state relationship of embodiments of the present invention. As seen in this diagram, an OTP array 110 has a different Vt for a programmed state in each subsequent programming cycle. This allows for multiple programming of such cells, effectively emulating a few times or multi-time programmable cell.

It will be understood by those skilled in the art that the new unprogrammed Vt does not necessarily have to be exactly the same as the prior programmed Vt as noted above. Any convenient target value for program/erased value can be utilized to designate a particular single logic state, as long as the new "erased" threshold value is equal to or higher than the prior cycle programmed threshold value. Nor is it necessary to implement four (4) separate P/E cycles; it will be understood that embodiments of the invention may use fewer or more depending on system requirements.

Moreover it will be understood that for simplicity all cells in the array 110 are re-programmed in each P/E cycle, but it is possible that such coverage may not be necessary in each instance, particularly in embodiments in which sub-arrays with redundancy are included such as described in the prior art.

Embodiments of the present invention thus use an available large programming window to create cells that can be re-used for multiple times, or in essence multiple single-bit cells over time with thresholds for a single logic state that varies with time. This varying behavior effectively allows for capacity time multiplexing—or time spreading—beyond what would otherwise simply result in a static multi-state cell having different thresholds for different logic states at a single moment in time. For an array containing M cells, N distinct discernible programming levels, and P desired binary reprogramming operations, the total capacity (Ct) of the array M*N is made divisible by P, so that at any particular P/E cycle therefore the available capacity of the array Ca=M*N/P. Or, given Ct, and a desired array Ca, it is possible to effectuate a programming of the array equal to P times, where Ct=P*Ca.

As alluded to above, in some variants of the invention, the erase (or reprogramming) of the array can be done automatically at predetermined intervals, based on expected device degradation factors, etc. For example it may be discovered that data should be refreshed after a certain time has passed, and in such embodiments the same data can be reproduced in array 110 albeit at higher threshold levels. Note also that in some instances where it is desirable to have a multi-bit cell, it is possible that in embodiments the target Vt for a programmed cell could be set even higher of course in any particular cycle. The only requirement associated with this approach is that the next erase cycle would need to increase the unprogrammed Vt to a value higher than the next logic state.

In other words, a first state would be an unprogrammed cell at a first Vt1; a second state would be at a different higher Vt2, and a third state would be at even higher Vt3. Each cycle would require a step-up for the lower threshold states into a value equal or higher than the prior cycle's highest threshold. So in the example above, a tri-state cell could be implemented using a combination of 1, 2 and 3 volt thresholds respectively in first program cycle. In the next cycle, the cells would be programmed with a combination of 3, 4 and 5 volt thresholds for the tri-state set of cell values, and so on. This effectively creates a hybrid combination of re-programmable and multi-state capabilities in an otherwise nominal OTP array or device.

Accordingly within a single array there may be cells with different voltage levels corresponding to the same logical data value, because part of the array has an unprogrammed level of Vt1, while another part or portion of the array has an unprogrammed state Vt2 which is higher. Consequently different portions of an array may be partitioned to use different sets of states. Similarly there may be both single bit and multi-level/multi-bit cells in the same array as well. In such instances one portion of the array may use a different number of states than another portion of the array. Note that the different Vt levels allow for an odd number of states for the data value, a characteristic that is useful in some applications.

In other instances a single cell could be implemented with multiple programmable thresholds, but each level may not be associated with a different data value. In other words an unprogrammed cell may have a threshold level Vt1, corresponding to a first logical state (0 or 1). The same cell may be programmed to a higher Vt2 or an higher Vt3. The latter levels may be associated with a single additional logical value (0 or 1) as a means of increasing reliability. Thus in a later read operation, any cell with a threshold level of Vt2 or higher would be considered as corresponding to the same data value. This approach effectively imitates the behavior of so-called dual-cell, single bit embodiments used in some applications that require additional robustness.

Although the example cited above refers to a charge storage type of nonvolatile memory cell, it is possible to implement the same concept to other types of non-volatile memory cell. For example, for the Phase Change Memory, or PCM, it is known that the intermediate states exist between fully crystalline and fully amorphous. Such intermediate states, and its associated intermediate electrical resistance, can also be used as different levels of data storage. The above descriptions are intended as merely illustrative embodiments of the proposed inventions. It is understood that the protection afforded the present invention also comprehends and extends to embodiments different from those above, but which fall within the scope of the present claims.

What is claimed is:

1. A method of programming a non-volatile device having memory cells each adapted to represent a logic state, and each including a floating gate, a control gate, a source region, a drain region, and a channel coupling said source region and said drain region, the method comprising:
   setting all the non-volatile device memory cells to a first reference state corresponding to a first logic value represented by a first threshold voltage Vt1;
   programming selected ones of the non-volatile device memory cells to a second reference state corresponding to a second logic value represented by a second threshold voltage Vt2, where Vt2>Vt1;
   resetting all the non-volatile device memory cells to a third reference state corresponding to said first logic value and represented by a third threshold voltage Vt3, where Vt3>=Vt2;
   reprogramming selected ones of the non-volatile device memory cells to a fourth reference state corresponding to said second logic value represented by a fourth threshold voltage Vt4, where Vt4>Vt3;
   wherein both programming and erasing a target logic state of the non-volatile device is performed by addition of electrons to the floating gate;
   and wherein each cell is reset to a common state prior to programming or reprogramming.

2. The method of claim 1 wherein said resetting operation does not require removal of charge from cells, such that the non-volatile device is operated only as a few times programmable device.

3. The method of claim 1 wherein said cell also stores a third logic value.

4. The method of claim 1 including a step: time multiplexing a total capacity (Ct) of the non-volatile memory device across P distinct periods such that an available capacity (Ca) =Ct/P at any moment in time.

5. The method of claim 1 wherein the memory cells store a multi-bit logic value during at least one of P distinct programming periods.

6. The method of claim 1 wherein the non-volatile memory device operates as a multi-time programmable array without requiring redundancy for each programming cycle.

7. The method of claim 1 wherein the non-volatile memory device is a multi-level cell that is operated by a controller as a single bit cell with a different program threshold voltage during each programming cycle.

8. The method of claim 7 wherein adjacent program threshold levels of the multi-level cell correspond to logical 0 and 1 states.

9. The method of claim 1 wherein said resetting and reprogramming are performed automatically at predetermined time intervals.

10. The method of claim 1 including a step: operating a first array in the non-volatile memory device with a first threshold voltage corresponding to a first logical state; and operating a second array in the non-volatile memory device with a second different threshold voltage corresponding to said same first logical state.

11. The method of claim 1 including a step: wherein the non-volatile memory device also operates with two different threshold voltages corresponding to a single logical state.

12. A method of programming a CMOS logic process compatible non-volatile device having a memory array with memory cells each adapted to represent a logic state, and each including a floating gate, a control gate, a source region, a drain region, and a channel coupling said source region and said drain region, the method comprising:

setting all the non-volatile device memory cells in the memory array to a first reference state corresponding to a first logic value represented by a first threshold voltage $Vt1$;

programming selected ones of the non-volatile device memory cells in the memory array to a second reference state corresponding to a second logic value represented by a second threshold voltage $Vt2$ using hot carrier injection, where $Vt2>Vt1$;

resetting all the non-volatile device memory cells in the memory array at predetermined intervals to a third reference state corresponding to said first logic value and represented by a third threshold voltage $Vt3$ using hot carrier injection, where $Vt3>=Vt2$;

wherein said resetting is performed as part of an automated security operation and/or degradation refresh operation in the non-volatile memory device;

reprogramming selected ones of the non-volatile device memory cells in the memory array after said predetermined intervals to a fourth reference state corresponding to said second logic value represented by a fourth threshold voltage $Vt4$ using hot carrier injection, where $Vt4>Vt3$;

wherein both programming and erasing a target logic state of the non-volatile device is performed by addition of hot electrons to the floating gate;

and wherein each cell in the memory cell array is set or reset to a common state prior to programming or reprogramming.

13. The method of claim 12 wherein different memory arrays are implemented in the non-volatile memory device with different threshold voltages corresponding to the same data logic state.

14. The method of claim 12 further including a step of dividing a total capacity (Ct) of the non-volatile memory array containing M cells and N distinct program levels into P distinct periods, comprising:

performing a first program operation in a 1st period of the P distinct periods to store logical data in the M cells of the array using at least two (2) or more separate program levels $\{PVt1, PVt2\}$ of the N distinct program levels;

performing a second program operation in a subsequent 2nd period of the P distinct periods to store logical data in the M cells of the array using at least (2) separate program levels $\{PVt3, PVt4\}$ of the N distinct program levels, wherein at least one of $\{PVt3, PVt4\}$ is different from and greater than $\{PVt1, PVt2\}$.

* * * * *